United States Patent
Xu et al.

(10) Patent No.: US 7,915,809 B2
(45) Date of Patent: Mar. 29, 2011

(54) ELECTROPHOSPHORESCENT ORGANIC LIGHT EMITTING DIODE FORMED USING SOLVENT SOLUBLE MATERIALS

(75) Inventors: Shihe Xu, Midland, MI (US); Masaaki Amako, Chiba (JP); Paul Schalk, Bay City, MI (US); Toshio Suzuki, Lexington, MA (US)

(73) Assignee: Dow Corning Corporation, Auburn, MI (US)

( * ) Notice: Subject to any disclaimer, the term of this patent is extended or adjusted under 35 U.S.C. 154(b) by 296 days.

(21) Appl. No.: 12/063,144

(22) PCT Filed: Aug. 24, 2006

(86) PCT No.: PCT/US2006/033081
§ 371 (c)(1),
(2), (4) Date: Jun. 3, 2008

(87) PCT Pub. No.: WO2007/044138
PCT Pub. Date: Apr. 19, 2007

(65) Prior Publication Data
US 2008/0303421 A1    Dec. 11, 2008

(51) Int. Cl.
*H01L 51/52* (2006.01)
(52) U.S. Cl. ............................ 313/504; 428/690
(58) Field of Classification Search .......... 428/690; 313/504
See application file for complete search history.

(56) References Cited

U.S. PATENT DOCUMENTS

| | | | | |
|---|---|---|---|---|
| 6,693,296 | B1 * | 2/2004 | Tyan | 257/40 |
| 2004/0170863 | A1 * | 9/2004 | Kim et al. | 428/690 |
| 2005/0234256 | A1 * | 10/2005 | Marks et al. | 556/413 |

OTHER PUBLICATIONS

Li, Weijin et al., Covalently Interlinked Organic LED Transport Layers via Spin-Coating/Siloxane Condensation, Advanced Materials, vol. 11, No. 9, pp. 730-734, Jul. 5, 1999.
Chang, Sung-Ch et al., Multicolor Organic Light-Emitting Diodes Processed by Hybrid Inkjet Printing, Advanced Materials, vol. 13, No. 19, pp. 1476-1480, Oct. 2, 2001.
Photocopy of Letter dated Dec. 2, 2009 from the Korean Intellectual Property Office ("KIPO") regarding cited references listed herein.

* cited by examiner

*Primary Examiner* — D. Lawrence Tarazano
*Assistant Examiner* — J. L. Yang
(74) *Attorney, Agent, or Firm* — Williams, Morgan & Amerson (57) ABSTRACT

The present invention provides an electrophosphorescent organic light-emitting diode (OLED). The electrophosphorescent OLED includes a substrate having a first opposing surface and a second opposing surface, a first electrode layer overlying the first opposing surface, and a light-emitting element overlying the first electrode layer. The light emitting element includes a hole injection layer and a phosphorescent emissive layer. The hole injection layer is formed of a crosslinked polysiloxane, which includes at least one siloxane unit R—Y—$SiO_{3/2}$ having at least one aromatic amine group (R) and at least one divalent organic group (Y). The aromatic amine group includes at least one of a carbazolyl group, a substituted carbazolyl group, a triarylamine group, and a substituted triarylamine group.

10 Claims, 6 Drawing Sheets

ELECTROPHOSPHORESCENT ORGANIC LIGHT EMITTING DIODE FORMED USING SOLVENT SOLUBLE MATERIALS

BACKGROUND OF THE INVENTION

1. Field of the Invention

This invention relates generally to organic light emitting diodes, and, more particularly, to electrophosphorescent organic light emitting diodes.

2. Description of the Related Art

Figure 1:
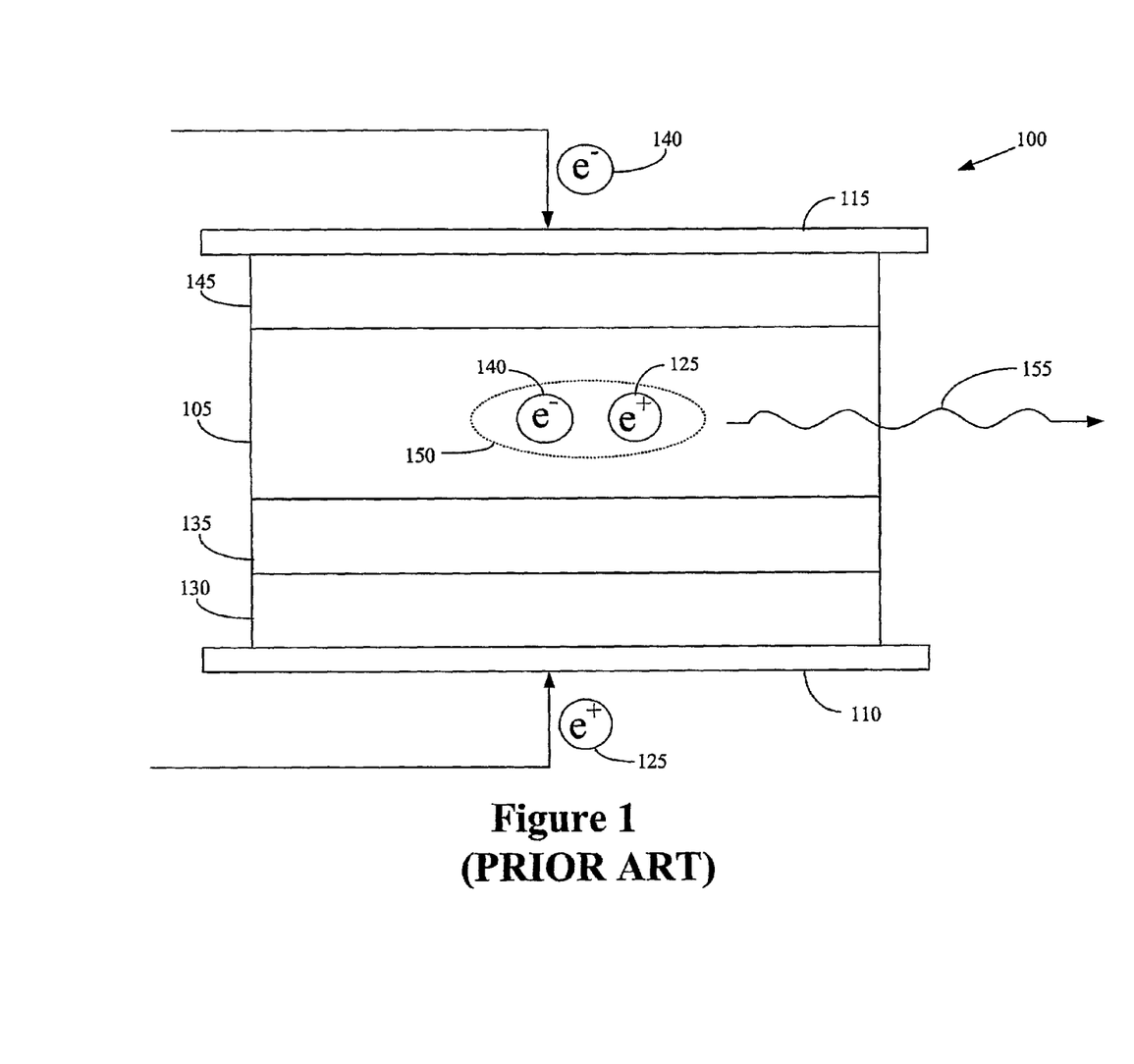
FIG. 1 conceptually illustrates a conventional electrophosphorescent organic light-emitting diode.

An organic light-emitting diode (OLED) is a thin-film light-emitting diode that uses an organic compound as an emissive layer. FIG. 1 conceptually illustrates a conventional OLED 100 that includes an emissive layer 105 sandwiched between an anode 110 and a cathode 115. The anode 110 is typically formed of indium tin oxide (ITO) and is used to provide holes 125 to a hole injection layer 130, which may then provide the injected holes 125 to a hole transport layer 135 and then to the emissive layer 105. The cathode 115 is used to provide electrons 140 to an electron transport layer 145 and then to the emissive layer 105. The holes 125 and the electrons 140 in the emissive layer 105 may combine to form excitons 150. The excitons 150 may be formed in either a singlet state (spin 0) or a triplet state (spin 1). The triplet state is more common than the singlet state because approximately 75% of the excitons 150 form in the triplet state, whereas only approximately 25% of the excitons 115 form in the singlet state.

The excitons 150 decay when the hole 125 and the electron 140 combine and release the energy stored in the exciton 150 as heat and/or light 155. In fluorescence OLEDs 100, the emissive layer 105 is formed of materials such that the energy released by singlet excitons 150 is released primarily as light and the energy released by the triplet excitons 150 is released primarily as heat. In contrast, the emissive layer 105 in a phosphorescent OLED 100 is formed of materials such that the energy released by triplet excitons 150 is released primarily as light. Most OLEDs are fluorescent OLEDs, at least in part because fluorescence is generally a faster and more efficient process than phosphorescence. However, phosphorescent OLEDs may be able to operate at a higher overall efficiency, at least in part because of the relatively large ratio of triplet-to-singlet excitons 150.

Conventional phosphorescent OLEDs have a number of drawbacks that have limited their potential usefulness. The organic materials that are used to form the hole injection layer 130 of a conventional phosphorescent OLED are not typically soluble and so must be evaporated onto the surface of the anode 110. For example, the hole injection layer 130 of a conventional phosphorescent OLED may be formed of insoluble small molecules. Depositing materials by evaporation forms a layer of approximately constant thickness over the underlying surface. Consequently, any imperfections in the surface of the anode 110, such as spikes and/or ditches, will also appear on the surface of other layers deposited above the anode 110, such as the hole injection layer 130. Furthermore, the organic materials that are used to form the hole transport layer 135 of a conventional phosphorescent OLED are typically hydrophobic small molecules and so the bond between these layers and hydrophilic layers, such as the surface of the anode 110, may be relatively weak and susceptible to separating when heated.

SUMMARY OF THE INVENTION

The present invention is directed to addressing the effects of one or more of the problems set forth above. The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

In one embodiment of the instant invention, an electrophosphorescent organic light-emitting diode (PhOLED) is provided. The electrophosphorescent OLED includes a substrate having a first opposing surface and a second opposing surface, a first electrode layer overlying the first opposing surface, and a light-emitting element overlying the first electrode layer. The light emitting element includes a hole injection layer and a phosphorescent emissive layer. The hole injection layer is formed of a crosslinked polysiloxane, which includes at least one siloxane unit R—Y—$SiO_{3/2}$ having at least one aromatic amine group (R) and at least one divalent organic group (Y). The aromatic amine group includes at least one of a carbazolyl group, a substituted carbazolyl group, a triarylamine group, and a substituted triarylamine group.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions should be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 2A:
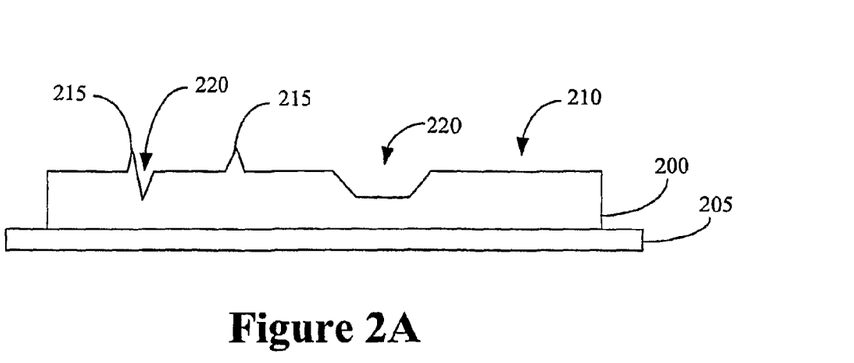
FIGS. 2A, 2B, 2C, 2D, and 2E conceptually illustrate one exemplary embodiment of a method of forming an electrophosphorescent organic light-emitting diode using a solvent-soluble material, in accordance with the present invention.

FIGS. 2A, 2B, 2C, 2D, and 2E conceptually illustrate one exemplary embodiment of a method of forming an electrophosphorescent organic light-emitting diode (PhOLED) using a solvent-soluble polysiloxane material. FIG. 2A conceptually illustrates an anode 200 formed over a substrate 205. As used herein, the term "over" used in reference to the position of the anode 200 relative to the substrate 200 means the anode 200 either lies directly on the substrate 205 or lies above the substrate 205 with one or more intermediary layers there between, provided the OLED 200 is oriented with the substrate 200 below the anode 205 as shown in FIG. 1. This convention will be adhered to whenever the term "over" or other terms indicating a relative position are used in reference to the relative position of two or more layers, substrates, or other components described below.

In various alternative embodiments, the substrate 200 can be a rigid or flexible material. Further, the substrate 200 can be transparent or nontransparent to light in the visible region of the electromagnetic spectrum. As used herein, the term "transparent" means the particular component (e.g., the substrate 200) has a percent transmittance of at least 30%, alternatively at least 60%, alternatively at least 80%, for light in the visible region (e.g., a wavelength of ~400 to ~700 mm) of the electromagnetic spectrum. Also, as used herein, the term "nontransparent" means the component has a percent transmittance less than 30% for light in the visible region of the electromagnetic spectrum. Examples of materials that may be used to form substrates 200 include, but are not limited to, semiconductor materials such as silicon, silicon having a surface layer of silicon dioxide, and gallium arsenide; quartz; fused quartz; aluminum oxide; ceramics; glass; metal foils; polyolefins such as polyethylene, polypropylene, polystyrene, and polyethyleneterephthalate; fluorocarbon polymers such as polytetrafluoroethylene and polyvinylfluoride; polyamides such as Nylon; polyimides; polyesters such as poly(methyl methacrylate) and poly(ethylene 2,6-naphthalenedicarboxylate); epoxy resins; polyethers; polycarbonates; polysulfones; and polyether sulfones.

The anode 200 may be formed using conventional techniques, such as evaporation, co-evaporation, DC magnetron sputtering, or RF sputtering, which are known to persons of ordinary skill in the art and therefore, in the interest of clarity, these techniques will not be described further herein. The anode 200 may be transparent or nontransparent to visible light. The anode 200 is typically selected from a high work-function (>4 eV) metal, alloy, or metal oxide such as indium oxide, tin oxide, zinc oxide, indium tin oxide (ITO), indium zinc oxide, aluminum-doped zinc oxide, nickel, and gold. An upper surface 210 of the anode 200 may have a number of imperfections. In the illustrated embodiment, the upper surface 210 includes one or more spikes 215 and one or more ditches 220. However, persons of ordinary skill in the art should appreciate that the upper surface 210 may include other imperfections not shown in FIG. 2A. For example, the upper surface 210 may exhibit dishing and/or other non-planarities.

Figure 2B:
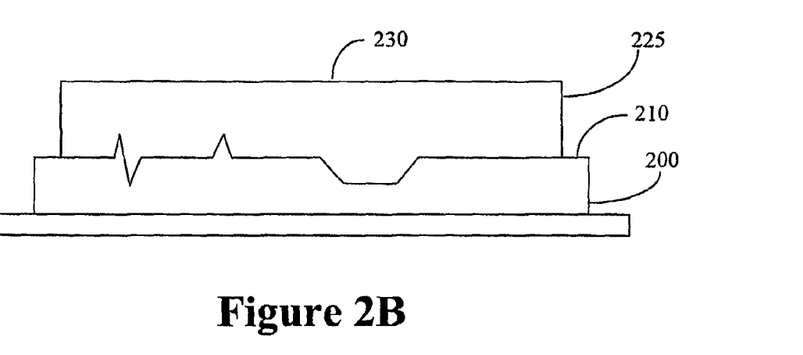

FIG. 2B conceptually illustrates a hole injection layer 225 that has been formed above the upper surface 210 of the anode 200. The hole injection layer 225 is formed of a solvent-soluble material such as an organic solvent-soluble organosilicon composition such as an electroactive organosilsesquioxane hydrolysate, which may include any carbazolyl-functional organosilsesquioxane or triphenylamine-containing organosilsesquioxane hydrolysate. In one embodiment, the hole injection layer 225 is formed of a crosslinked polysiloxane that includes at least one siloxane unit, which may be represented by the formula R—Y—SiO$_{3/2}$. In the formula for the siloxane group, the letter R represents an aromatic amine group and Y represents a divalent organic group containing 1-6 carbon atoms. In alternative embodiments, the crosslinked polysiloxane may include one or more SiO$_{4/2}$ units and/or one or more TiO$_{4/2}$ units.

Figure 3:
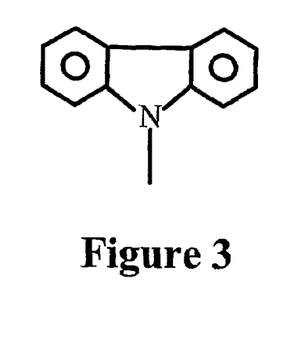
FIG. 3 conceptually illustrates a carbazolyl group, in accordance with the present invention.
Figure 4A:
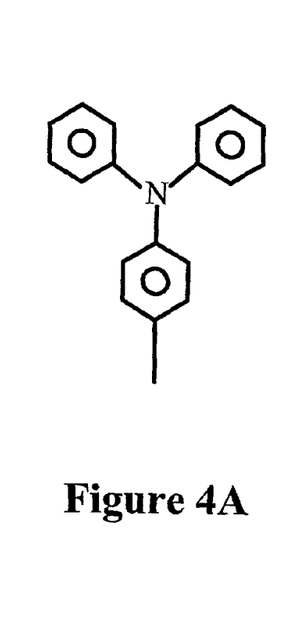
FIGS. 4A, 4B, 4C, 4D, and 4E conceptually illustrate triarylamine groups, in accordance with the present invention.
Figure 4B:
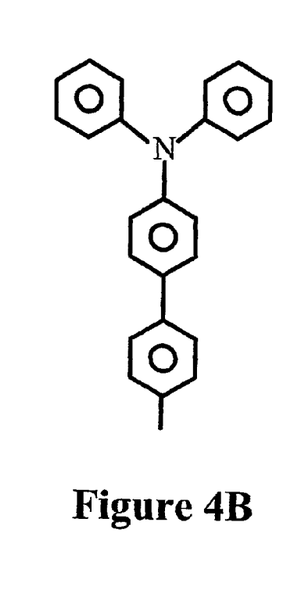
Figure 4C:
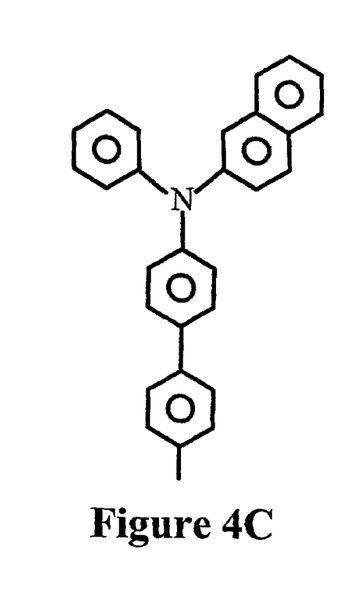
Figure 4D:
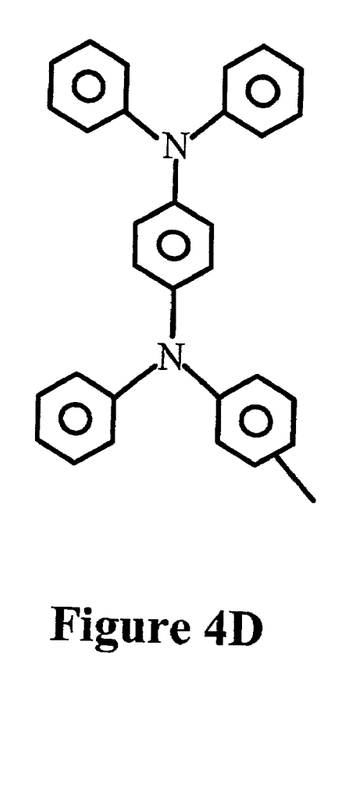
Figure 4E:
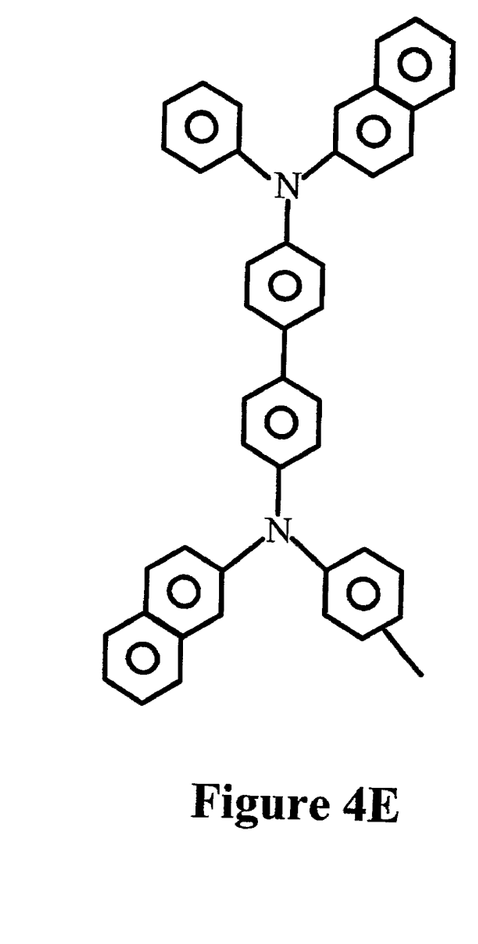

The aromatic amine group, R, may be selected from a variety of suitable groups. In one embodiment, the aromatic amine group, R, is a carbazolyl group, such as the carbazolyl group shown in FIG. 3, or a substituted carbazolyl group. The carbazolyl group may also optionally include substitute groups such as methyl groups and/or ethyl groups. In other embodiments, the aromatic group, R, is a triarylamine group, such as one of the triarylamine groups shown in FIGS. 4A, 4B, 4C, 4D, and 4E, or a substituted triarylamine group. The triarylamine groups may also optionally include substitute groups such as methyl groups and/or ethyl groups. In alternative embodiments, one or more —Y—SiO$_{3/2}$ groups may be substituted for one or more hydrogen atoms in the aromatic amine group, R.

Referring back to FIG. 2B, spin-coating, printing, and/or other solution deposition techniques may be used to form the hole injection layer 225. In one embodiment, a hole injection layer 225 having a thickness of less than or approximately 200 nm may be spin coated onto the upper surface 210 of the anode 200. The solvent-soluble material may flow in or around the spikes 215, the ditches 220, or other imperfections in the upper surface 210 during or after the deposition process. Consequently, an upper surface 230 of the hole injection layer 225 may be relatively more planar than the upper surface 210 of the anode 200. Following the deposition process, the hole injection layer 225 may be cured.

Figure 2C:
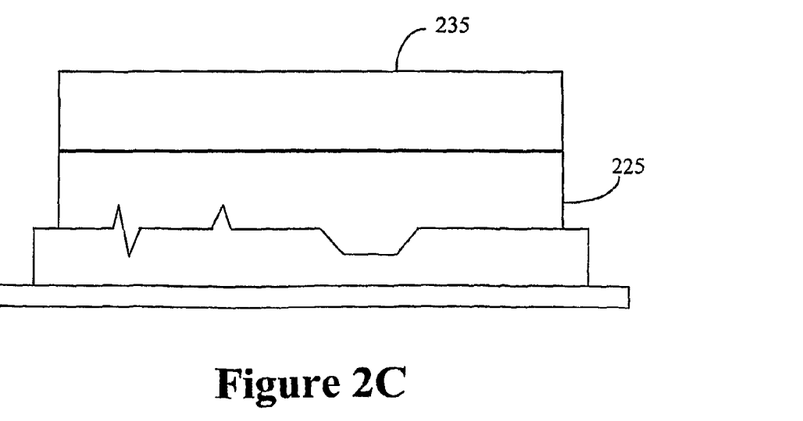

FIG. 2C conceptually illustrates a hole transport layer 235 that has been formed above the upper surface 230 of the hole injection layer 225. In the illustrated embodiment, the hole transport layer 235 is formed of a conventional small molecule hole transport material such as TPD [1,4-bis(phenyl-m-tolyamino)biphenyl) or NPD [1,4-bis(1-Naphthylphenylamino)biphenyl)] using high vacuum vapor deposition techniques. However, in some embodiments, the hole transport layer 235 may be omitted or, alternatively, may be formed of the same solvent-soluble material that was used to form the hole injection layer 225. For example, the hole injection layer 225 may perform both the hole injection function and the hole transport function and a separate hole transport layer 235 may not be formed. For another example, the hole transfer layer 235 may be formed by coating a solvent-soluble material above the upper surface 230 of the hole injection layer 225.

Figure 2D:
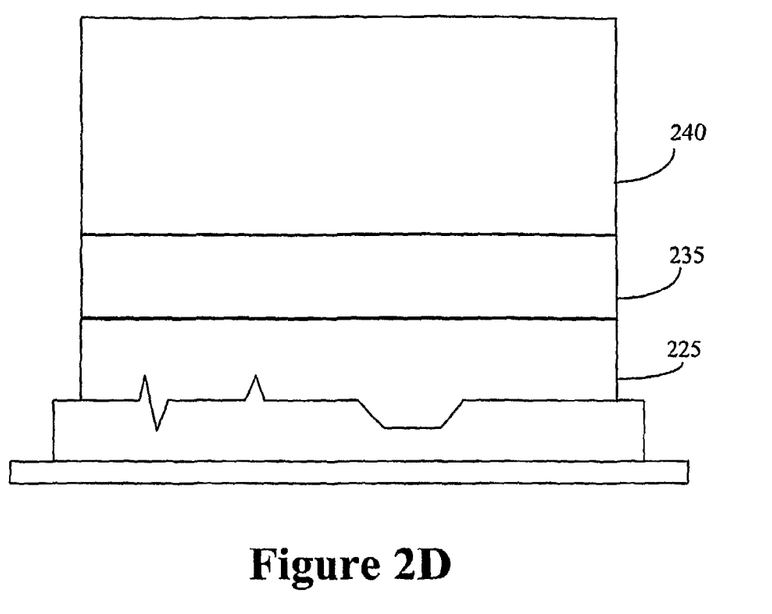

FIG. 2D conceptually illustrates an electrophosphorescent emissive layer 240 that has been formed above the hole transport layer 235. However, persons of ordinary skill in the art should appreciate that the electrophosphorescent emissive layer 240 may be formed over other layers. For example, in embodiments that do not include the hole transport layer 235, the electrophosphorescent emissive layer 240 may be formed above the hole injection layer 225. In the illustrated embodiment, the electrophosphorescent emissive layer 240 is formed of an electrophosphorescent material and/or a host material containing an electrophosphorescent dye. For example, the electrophosphorescent emissive layer 240 may be formed of conventional electrophosphorescent dye-containing materials. However, in alternative embodiments, the electrophosphorescent emissive layer 240 may be formed by dispersing electrophosphorescent dye in a solvent-soluble host material, such as the organic solvent-soluble organosilicon compositions described above. The electrophosphorescent emissive layer 240 may then be formed using the solution deposition techniques described above.

Figure 2E:
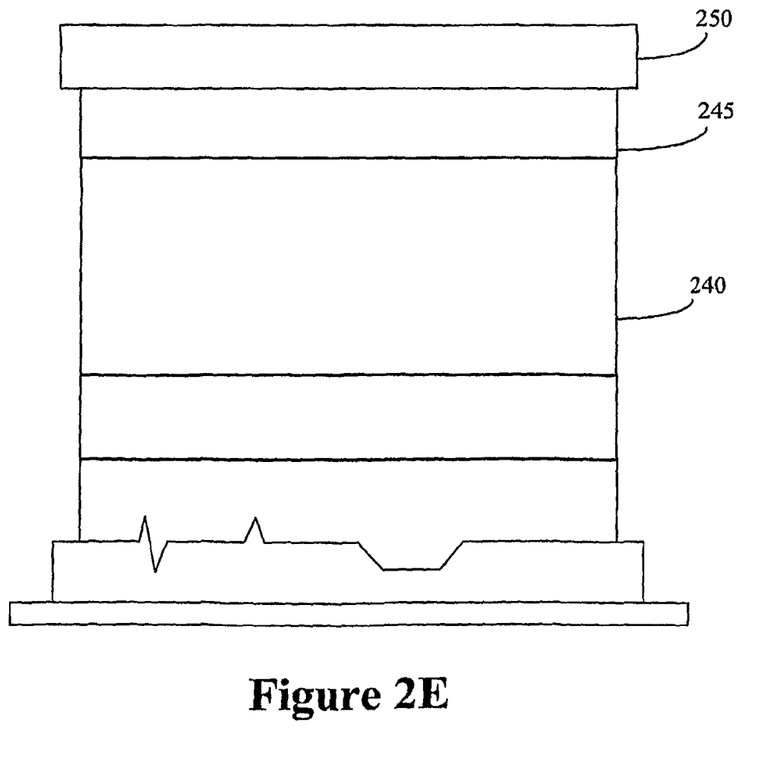

FIG. 2E conceptually illustrates an electron transport layer 245 that has been formed above the electrophosphorescent emissive layer 240, and a cathode 250 that has been formed above the electron transport layer 245. The electron transport layer 245 may be formed of any suitable materials such as Alq3 and the like. In various alternative embodiments, the cathode 250 can be a low work-function (<4 eV) metal such as Ca, Mg, and Al; a high work-function (>4 eV) metal, alloy, or metal oxide, as described above; or an alloy of a low-work function metal and at least one other metal having a high or low work-function, such as Mg—Al, Ag—Mg, Al—Li, In—Mg, and Al—Ca. The cathode 250 may or may not include an electron injection enhancement layer (not shown in FIG. 2E).

Figure 5:
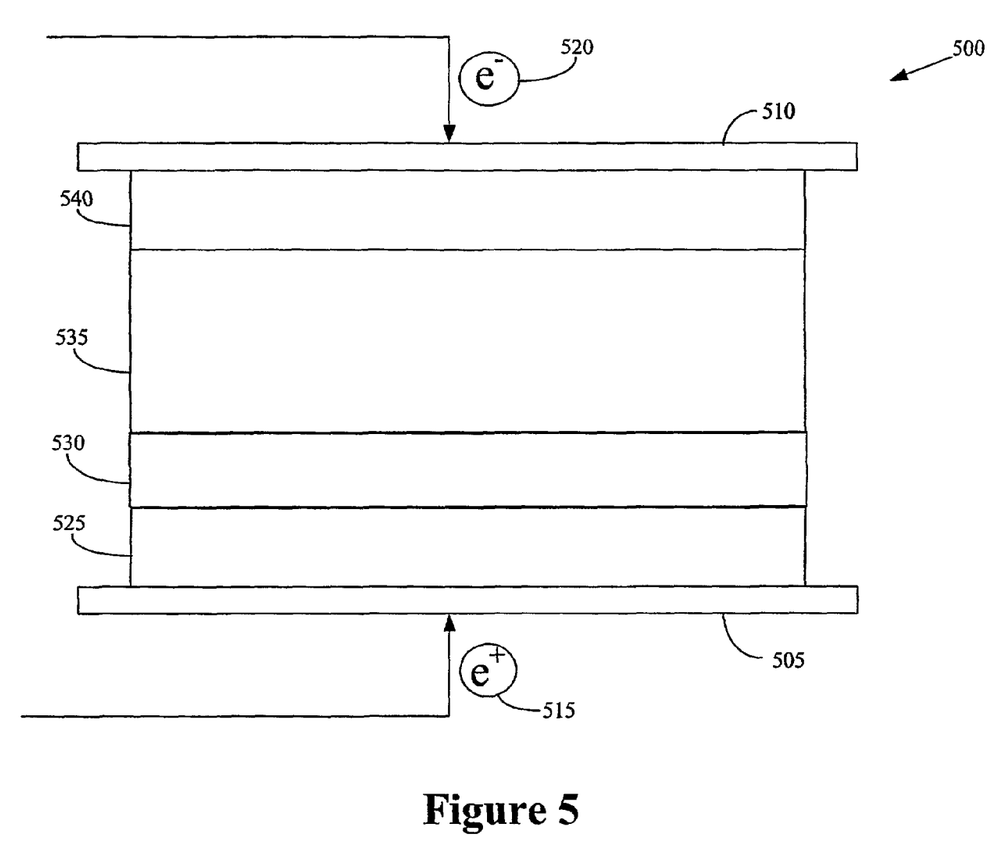
FIG. 5 conceptually illustrates one exemplary embodiment of an electrophosphorescent organic light-emitting diode, in accordance with the present invention.

FIG. 5 conceptually illustrates one exemplary embodiment of an electrophosphorescent organic light-emitting diode 500. In the illustrated embodiment, the electrophosphorescent organic light-emitting diode 500 includes an anode 505 and a cathode 510 for providing holes 515 and electrons 520, respectively. The electrophosphorescent organic light-emitting diode 500 also includes a hole injection layer 525 disposed above the anode 505. The hole injection layer 525 is formed of a solvent-soluble material, as discussed above. In the illustrated embodiment, the electrophosphorescent organic light-emitting diode 500 also includes a hole transport layer 530. However, as discussed above, the hole transport layer 530 is an optional element that may be omitted. In some embodiment, the functions that would be performed by the omitted hole transport layer 530 may be performed by portions of the hole injection layer 525.

An electrophosphorescent emissive layer 535 is disposed above the hole transport layer 530 and an electron transport layer 540 is disposed above the electrophosphorescent emissive layer 535 and below the cathode 510. Presence of ordinary skill in the art should appreciate that the electrophosphorescent organic light-emitting diode 500 may also include other layers not shown in FIG. 5, such as one or more exciton blocking layers.

The hole injection layer 525 can dramatically enhance the hole injection, which may lead to lower turn-on voltages and/or higher efficiency from the electrophosphorescent organic light emitting diode 500. For example, the data shown in Table 1 were obtained with a series of PhOLEDs with the following structures: ITO/HI-HTL/CBP:Ir(PPy)3(20 nm)/ BCP(5 nm)/Alq3(40 nm)/LiF(0.8 nm)/Al (150 nm), where HI-HIL layers are a serious combination of a silsesquioxane hydrolysate layers and NPD layers as defined in Table 1; CBP:Ir(PPY)$_3$ layers were fabricated with co-evaporation of 4,4'-dicarbazolyl-1,1-biphenyl (CBP) and tris(2-phenylpyridine) Iridium (III) [Ir(PPy)$_3$] at a deposition rate ratio of 28:1; BCP is 2,9-dimethyl-4,7-diphenyl-1,10-phenanthroline, and Alq3 is tris(8-hydroxyquinato) aluminum (III).

TABLE 1

Turn on voltages and luminous efficiencies of the green PhOLEDs with various combinations of hydrolysate and NPD layers (HI-HTL)

| Sample No. | Hydrolysate Layer Thickness (nm) | NPD Layer Thickness (nm) | Volt @1 cd m$^{-2}$ | Maximum Luminous Efficiency (cd A$^{-1}$) |
|---|---|---|---|---|
| 1 | 0 | 0 | 2.8 | 16.7 |
| 2 | 0 | 40 | 3.9 | 20.1 |
| 3 | 15 | 40 | 3.5 | 24.2 |
| 4 | <10 | 30 | 3.1 | 29.7 |
| 5 | 15 | 30 | 3.3 | 42.3 |
| 6 | <10 | 0 | 3.3 | 35.1 |
| 7 | 55 | 0 | 3.9 | 38.5 |

The hole injection layer 525 may also increase the stability of the electrophosphorescent organic light-emitting diode 500 by improving adherence at the anode/organic interface, e.g. the interface between the anode 505 and the electrophosphorescent emissive layer 535. The solvent-soluble materials described above include both hydrophilic (—SiO$_{3/2}$) and hydrophobic portions (e.g., aromatic rings). When the solvent-soluble material is deposited onto the anode 505, the hole injection materials can bind to the anode 505 through the —Si—O-Metal bonds which then compatibilize the anode/organic interfaces. Consequently, the hole injection layer may improve the adhesion of the organic materials to the anode.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. An electrophosphorescent organic light-emitting diode (OLED), comprising:
   a substrate having a first opposing surface and a second opposing surface;
   a first electrode layer overlying the first opposing surface; and
   a light-emitting element overlying the first electrode layer, the light emitting element comprising a hole injection layer, a phosphorescent emissive layer and an electron transport layer, the hole injection layer comprising a crosslinked polysiloxane, the crosslinked polysiloxane comprising at least one siloxane unit R—Y—SiO$_{3/2}$ that comprises at least one aromatic amine group (R) and at least one divalent organic group (Y), the aromatic amine group comprising at least one of a carbazolyl group, a substituted carbazolyl group, a triarylamine group, and a substituted triarylamine group.

2. The electrophosphorescent OLED of claim 1, wherein said at least one divalent organic group (Y) comprises between one and six carbon atoms.

3. The electrophosphorescent OLED of claim 1, wherein at least one —Y—$SiO_{3/2}$ group is substituted for at least one hydrogen atom in the aromatic amine group.

4. The electrophosphorescent OLED of claim 1, wherein the crosslinked polysiloxane comprises at least one of a $SiO_{4/2}$ unit and a $TiO_{4/2}$ unit.

5. The electrophosphorescent OLED of claim 1, wherein the hole injection layer is formed by spin coating a solvent-soluble material comprising said at least one siloxane unit or any solvent based coating processing techniques.

6. The electrophosphorescent OLED of claim 1, wherein the hole injection layer has a thickness of less than or approximately 200 nm.

7. The electrophosphorescent OLED of claim 1, comprising at least one of a hole transport layer, and an exciton blocking layer.

8. The electrophosphorescent OLED of claim 7, wherein the hole transport layer is formed by coating a solvent-soluble material or deposited by high vacuum deposition of a hole transporting material.

9. The electrophosphorescent OLED of claim 1, wherein the electrophosphorescent emissive layer comprises an organic solvent-soluble organosilicon composition and at least one electrophosphorescent dye.

10. The electrophosphorescent OLED of claim 9, wherein the organic solvent-soluble organosilicon composition comprises at least one of a carbazolyl-functional polysilsesquioxane and a triphenylamine-containing polysilsesquioxane hydrolysate.

* * * * *